(12) United States Patent
Shuto et al.

(10) Patent No.: US 7,152,314 B2
(45) Date of Patent: Dec. 26, 2006

(54) METHOD OF MANUFACTURING CIRCUIT BOARD

(75) Inventors: Takashi Shuto, Kawasaki (JP); Takefumi Kashiwa, Kawasaki (JP); Kenji Takano, Kawasaki (JP); Kenji Iida, Kawasaki (JP); Kenichiro Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 10/765,209

(22) Filed: Jan. 28, 2004

(65) Prior Publication Data

US 2004/0211751 A1 Oct. 28, 2004

(30) Foreign Application Priority Data

Jan. 29, 2003 (JP) .............................. 2002-020436

(51) Int. Cl.
*H05K 3/36* (2006.01)
(52) U.S. Cl. .............................. 29/830; 29/825; 29/832
(58) Field of Classification Search .................. 29/825, 29/830, 832
See application file for complete search history.

(56) References Cited

U.S. PATENT DOCUMENTS 4,830,691 A * 5/1989 Kida et al. ..................... 216/18
5,297,480 A * 3/1994 Miyashita et al. ............. 100/90
6,391,220 B1 5/2002 Zhang et al.
6,739,040 B1 * 5/2004 Nakamura et al. ............. 29/830
2003/0162386 A1 8/2003 Ogawa et al.

FOREIGN PATENT DOCUMENTS

| JP | 6-216524 | 5/1994 |
|---|---|---|
| JP | 2001-94232 | 4/2001 |
| JP | 2002-164467 | 7/2002 |
| JP | 2004-87701 | 3/2004 |
| WO | WO 96/18284 | 6/1996 |

\* cited by examiner

*Primary Examiner*—Carl J. Arbes
(74) *Attorney, Agent, or Firm*—Staas & Halsey LLP

(57) ABSTRACT

The method of manufacturing a circuit board is capable of preventing deformation of a core substrate, ensuring size thereof and highly concentrating cable patterns so as to realize compact and high-performance semiconductor devices. The method of manufacturing a circuit board of the present invention comprises the steps of: forming a multilayered body, in which cable patterns on different layers insulated by an insulating layer are electrically connected, on a core substrate by a buildup process; and separating the multilayered body from the core substrate. A metal layer is vacuum-adhered on the core substrate. The multilayered body is formed on the metal layer by the buildup process and separated from the core substrate together with the metal layer by breaking the vacuum state between the core substrate and the metal layer

15 Claims, 8 Drawing Sheets

METHOD OF MANUFACTURING CIRCUIT BOARD

BACKGROUND OF THE INVENTION

The present invention relates to a method of manufacturing a circuit board, more precisely relates to a thin circuit board on which cable patterns can be highly concentrated.

A conventional method of manufacturing a printed circuit board, in which multilayered cable patterns are formed on both sides of a core substrate by a buildup process, will be explained with reference to FIGS. 8A–9D.

FIGS. 8A–8F show the steps of forming a core section, in which cable patterns are piled on the both surfaces. In FIG. 8A, copper films 11 are adhered on a core substrate 10. The core substrate 10 comprises a core member 10a, which is made of epoxy resin including glass cloth, and the copper films 11, which respectively cover an upper surface and a lower surface of the core member 10a.

In FIG. 8B, through-holes 12 are bored, by a drill, in the core substrate 10. An inner diameter of each through-hole 12 is about 250 µm. In FIG. 8C, inner faces of the through-holes 12 are coated with copper layers 14 by plating, so that cable patterns on the upper surface and the lower surface of the core substrate 10 can be electrically connected.

In FIG. 8D, the through-holes 12 are filled with resin 16 so as to form cable patterns on the upper surface and the lower surface of the core substrate 10. In FIG. 8E, copper layers 18 are formed on the both surfaces of the core substrate 10 as lid layers. By forming the lid layers, the whole surfaces of the core substrate 16 including end faces of the resin 16 can be covered with the copper lid layers 18.

In FIG. 8F, cable patterns 20 are formed on the both surfaces of the core substrate 10, by etching the copper layers 14 and 18 and the copper films 11, so as to form the core section 22. Note that, in this example, the cable patterns 20 are formed by a subtract process, so concentration of the cable patterns 20 is limited.

FIGS. 9A–9D show the steps of forming a printed circuit board, in which cable patterns are formed on the both surfaces of the core section 22.

In FIG. 9A, cable patterns 24 are formed on the both surfaces of the core section 22 by a buildup process. Symbols 26 stand for insulating layers. The cable patterns 24 in different layers are electrically connected by vias 28. In FIG. 9B, the surfaces of the substrate, on which the cable patterns 24 are formed, are coated with photosensitive solder resist 30, then they are exposed and developed, so that prescribed parts of the surfaces of the substrate are coated with the solder resist 30. In FIG. 9C, surfaces of the cable patterns 24 are coated by electroless nickel plating and electroless gold plating. Further, the exposed surfaces of the cable patterns are coated with protection layers 32 by plating. In FIG. 9D, solder bumps 34 are formed at electrodes of the cable patterns 24. By the above described steps, the printed circuit board 36 is completed.

These days, thin and compact semiconductor devices are required, so thin circuit boards, on which semiconductor devices will be mounted, having highly concentrated cable patterns are required. However, the through-holes are bored in the substrate by a drill, so the inner diameter of each through-hole 12 must be about 250 µm. Namely, it is impossible to bore the through-holes 12 with narrower separations, so that concentration of cable patterns must be limited. In the conventional printed circuit board having the core substrate, separations between electrodes of a semiconductor chip to be mounted are, for example, 200 µm, but separations between electrodes for connecting with external devices are, for example, 200 µm, therefore separations between cable patterns must be made wider toward the electrodes for connecting with external devices. Concentration of cable patterns in the printed circuit board is further limited.

The core substrate 10 of the thin circuit board must be thin. However, a special manufacturing line, in which thin core substrates can be conveyed and treated, is required. Thin substrates are apt to be deformed by stresses, which are generated in the steps of forming the insulating layers and the plated layers. Therefore, it is difficult to control size of the thin circuit board, so that accuracy of the thin circuit board, in which highly concentrated cable patterns will be formed, must be lower.

SUMMARY OF THE INVENTION

The present invention was invented to solve the above described problems.

An object of the present invention is to provide a method of manufacturing a thin circuit board, which is capable of preventing deformation of a core substrate, ensuring size thereof and highly concentrating cable patterns so as to realize compact and high-performance semiconductor devices.

To achieve the object, the present invention has following constitutions.

Namely, the method of manufacturing a circuit board of the present invention comprises the steps of: forming a multilayered body, in which cable patterns on different layers insulated by an insulating layer are electrically connected, on a core substrate by a buildup process; and separating the multilayered body from the core substrate, wherein a metal layer is vacuum-adhered on the core substrate, the multilayered body is formed on the metal layer by the buildup process, and the multilayered body is separated from the core substrate together with the metal layer by breaking the vacuum state between the core substrate and the metal layer. Note that, various kinds of boards having enough toughness, e.g., plastic board, boards whose both surfaces are coated with copper layers, metal boards, may be employed as the core substrate. The vacuum-adhesion may be executed by, for example, sucking the metal layer on the surface of the core substrate with negative pressure and air-tightly sealing outer edges of the core substrate with an adhesive. The vacuum state can be broken by cutting the substrate together with an air-tightly sealed part.

And, the method of manufacturing a circuit board of the present invention comprises the steps of: forming a multilayered body, in which cable patterns on different layers insulated by an insulating layer are electrically connected, on a core substrate by a buildup process; and separating the multilayered body from the core substrate, wherein a first metal layer is adhered on the core substrate, a second metal layer is vacuum-adhered on the first metal layer, the multilayered body is formed on the second metal layer by the buildup process, and the multilayered body is separated from the core substrate together with the second metal layer by breaking the vacuum state between the first metal layer and the second metal layer.

In the method, the second metal layer may be broader than the first metal layer, an outer edge of the second metal layer, which is vacuum-adhered on the first metal layer, may be adhered on the core substrate, and the multilayered body and the core substrate may be cut at a position slightly shifted inward from an outer edge of the first metal layer so as to break the vacuum state between the first metal layer and the second metal layer, whereby the multilayered body is separated from the core substrate together with the second metal layer.

Note that, by air-tightly sealing outer edges of the vacuum-adhered part with, for example, an adhesive, when the first metal layer and the second metal layer are vacuum-adhered, the vacuum state of the air-tightly sealed part can be maintained. By vacuum-adhering the first metal layer and the second metal layer and adhering the outer edge of the second metal layer to the surface of the core substrate with, for example, an adhesive, the vacuum state between the first metal layer and the second metal layer can be maintained.

Further, the method of manufacturing a circuit board of the present invention comprises the steps of: forming a multilayered body, in which cable patterns on different layers insulated by an insulating layer are electrically connected, on a core substrate by a buildup process; separating the multilayered body from the core substrate; and applying a prescribed treatment to the multilayered body which has been separated.

In the method of the present invention, the multilayered body is formed on the core substrate, as a base, by the buildup process, so that deformation of the multilayered body, e.g., shrinkage, warp, can be prevented. Therefore, size of the circuit board can be correctly controlled, and the cable patterns can be precisely formed therein. Further, the cable patterns are formed in the multilayered body by the buildup process, so that the circuit board including the multilayered body is thin and compact, and the cable patterns are highly concentrated therein.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1A:
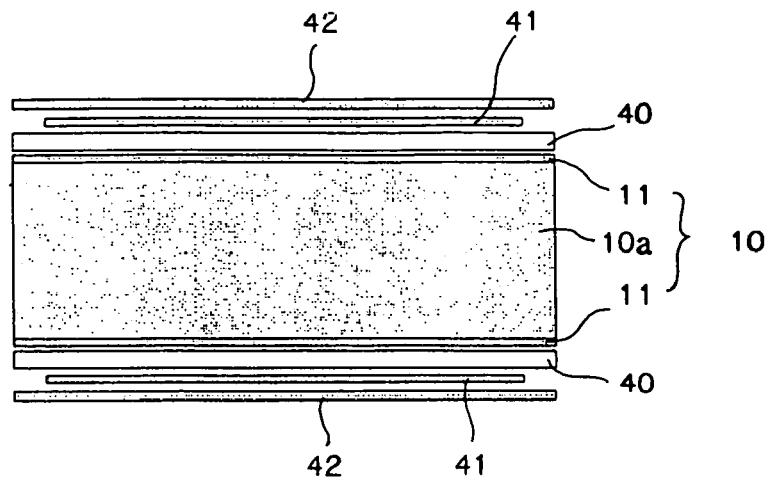
FIGS. 1A–1C are explanation views showing the steps of forming cable patterns on both surfaces of a core substrate.
Figure 1B:
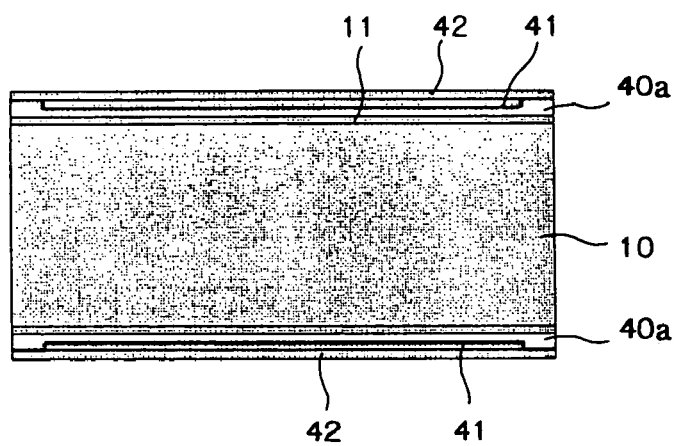
Figure 1C:
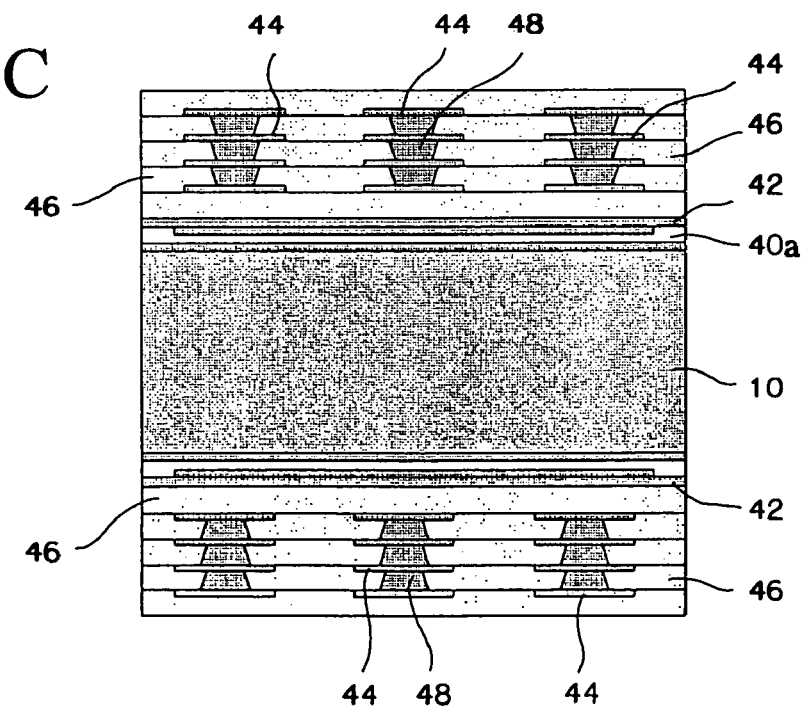

FIGS. 1A–1C are explanation views showing the method of manufacturing a circuit board of the present invention.

FIG. 1A shows a characteristic step of the present invention wherein first metal layers 41 and second metal layers 42 are adhered on the both surfaces of a core substrate 10, which includes a core member 10a and copper films 11 adhered on the both surfaces of the core member 10a, by adhesive films 40.

To securely treat and convey the core substrate 10, the core substrate 10 has enough firmness. Further, the core substrate 10 has enough toughness so as to prevent deformation caused by stresses, which are generated when insulating layers and plated layers are formed on the core substrate 10. In the present embodiment, the core member 10a is an epoxy plate, whose thickness is 0.3–0.4 mm and which includes glass cloth. Further, the copper films having thickness of 9 μm are adhered on the both surfaces of the core member 10a of the core substrate 10. Note that, the core substrate 10 may be made of other materials, which have enough toughness, other than an epoxy resin plate including glass cloth. A tough plastic plate, a metal plate, etc. may be employed as the core substrate.

In the present embodiment, a plurality of the core substrates 10 are formed in one large substrate. Therefore, insulating layers and plated layers are formed on the large substrate so as to manufacture a plurality of circuit boards in the large substrate.

In the present embodiment, the adhesive films 40 are made of thermosetting resin, e.g., epoxy; the first metal layers 41 are made of copper films having thickness of 18 μm; and the second metal layers 42 are made of copper films having thickness of 35 μm.

The adhesive films 40 adhere and fix the first metal layers 41 on the surfaces of the core substrate 10 and adhere outer edges of the second metal layers 42 on the core substrate 10. Therefore, the adhesive films 40 respectively cover the whole surfaces of the core substrate 10, and outer edges of the first metal layers 41 are located slightly inside with respect to the outer edges of the second metal layers 42. Namely, the second metal layers 42 are designed to be broader than the first metal layers 41.

In FIG. 1B, the first metal layers 41 and the second metal layers 41 are pressed on the both surfaces of the core substrate 10, together with the adhesive films 40, by vacuum hot press. In the process of vacuum hot press, the whole core substrate 10 shown in FIG. 1A is sucked by vacuum or negative pressure, then the first metal layers 41 and the second metal layers 42 piled are heated and pressed together with the adhesive films 40. By the vacuum hot press, the first metal layers 41 are fixed on the copper films 11 of the both surfaces of the core substrate 10 with the adhesive films 40a; the outer edges of the second metal layers 42 are fixed on the copper films 11 of the both surfaces of the core substrate 10 with adhesive layers 40a.

Figure 2:
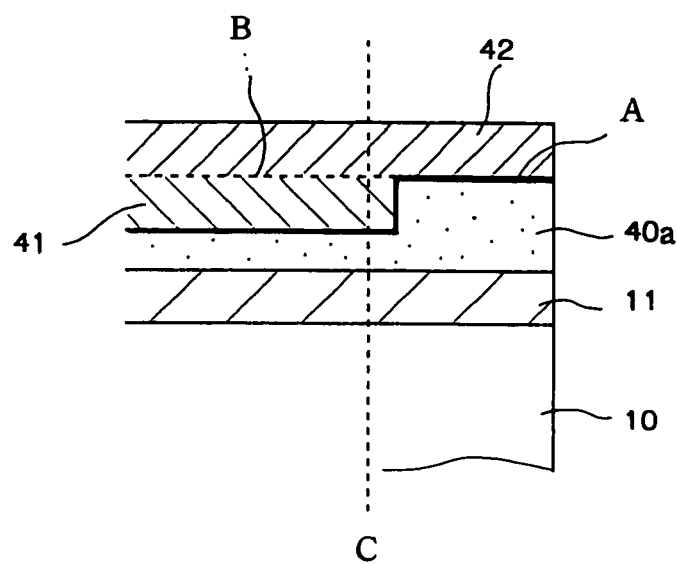
FIG. 2 is an enlarged view of an adhered part, in which an adhesive layer, a first metal layer and a second metal layer are adhered.

FIG. 2 is an enlarged view of an adhered part, in which an adhesive layer, the first metal layer 41 and the second metal layer 42 are adhered on the core substrate 10 with the adhesive layer 40a. The first metal 41 and the second metal layer 42 are adhered on the adhesive layer 40a along a thick solid line "A". The first metal layer 41 is vacuum-adhered on the second metal layer 42 along a dotted line "B". The two metal layers 41 and 42 are mutually stuck by vacuum or negative pressure. Namely, if the vacuum state of the vacuum-adhered part of the two metal layers 41 and 42 is broken, the first metal layer 41 can be peeled from the second metal layer 42.

In FIG. 1C, cable patterns 44 are formed on the surfaces of the second metal layers 42, which have been adhered on the both surfaces of the core substrate 10, by a buildup process. Symbols 46 stand for insulating layers. The cable patterns 44 in different layers are electrically connected by vias 48.

In the present embodiment, the vias 48 are filled vias, which are vertically connected like pillars, as shown in FIG. 1C. Note that, the cable patterns 44 are optionally designed in any layers.

Figure 3A:
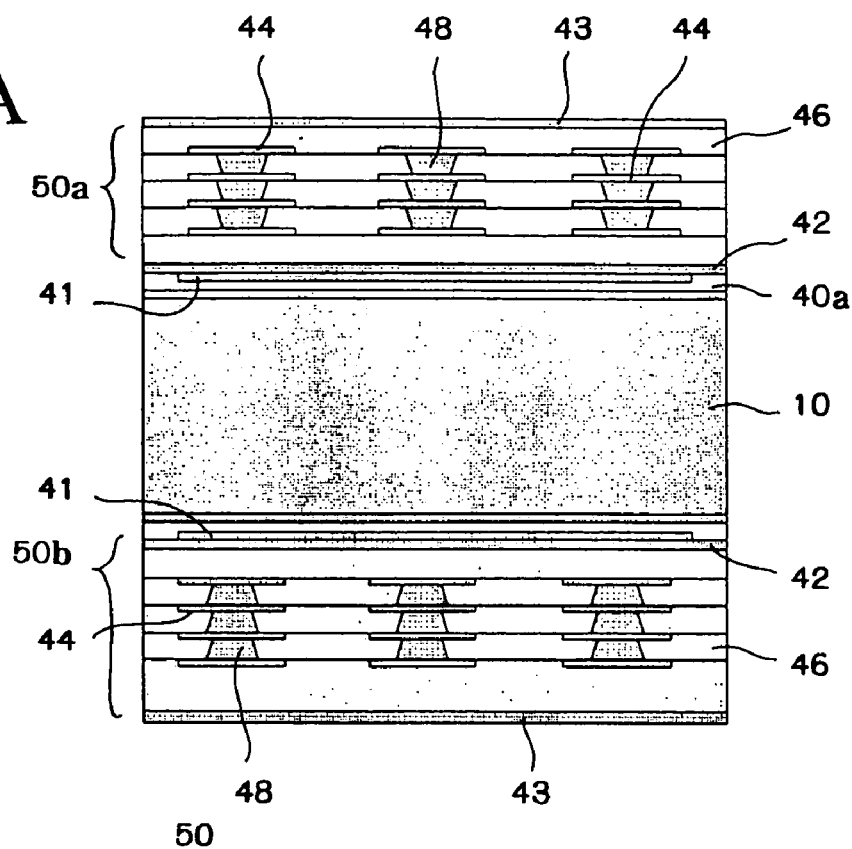
FIGS. 3A–3C are explanation views showing the steps of separating multilayered bodies from the core substrate.
Figure 3B:
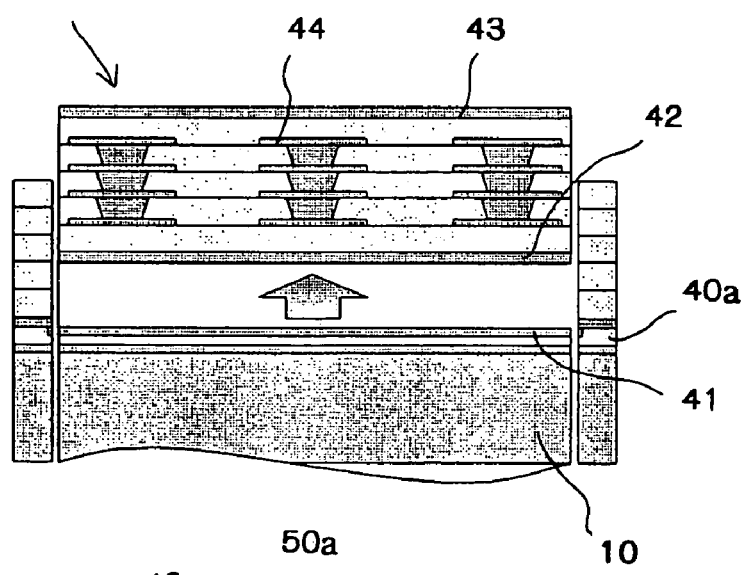
Figure 3C:
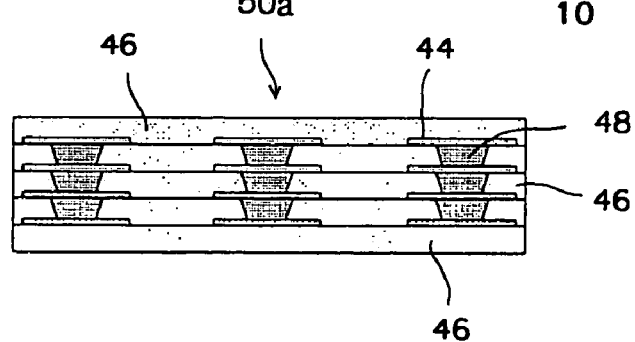

FIGS. 3A–3C are explanation views showing the steps of separating multilayered bodies 50a and 50b, which are multilayered parts including the cable patterns 44, the insulating layers 46 and vias 48 formed on the both sides of the core substrate 10 by the buildup process, from the core substrate 10.

In FIG. 3A, third metal layers 43 are formed on outer surfaces of the multilayered bodies 50a and 50b, and their thickness is equal to that of the second metal layers 42. The third metal layers 43 are formed to prevent warps of the multilayered bodies 50a and 50b, which includes the cable patterns 44, the insulating layers 46 and the vias 48, when the multilayered bodies 50a and 50b are separated from the core substrate 10.

Thickness of the multilayered bodies 50a and 50b are 300–400 μm, and the multilayered bodies 50a and 50b have enough firmness. Therefore, the multilayered bodies 50a and 50b can be safely treated and conveyed in the following process. However, the multilayered body is sometimes warped by unbalance of stresses in the both surfaces thereof. The third metal layer 43 balances the stresses in the both surfaces of each multilayered body, so that the warp of the multilayered bodies 50a and 50b can be prevented when the multilayered bodies 50a and 50b are separated from the core substrate 10. In the present embodiment, the second metal layers 42 are copper films; the third metal layers 43 are plated metal layers whose thickness are equal to that of the second metal layers 42.

Note that, in the present embodiment, the cable patterns 44 and the five insulating layers 46 of each multilayered body are symmetrically formed in the vertical direction. With this structure, the stresses in the upper surface and the lower surface of the multilayered body can be balanced, so that the warps can be prevented.

In FIG. 3B, the core substrate 10 and the buildup layers are cut along the outer edges of the core substrate 10, etc., so that the multilayered body 50a including the cable patterns 44 is separated from the core substrate 10. The core substrate 10, etc. are cut along a line "C" shown in FIG. 2, namely the positions of cutting them are slightly shifted inward from a profile line of the first metal layers 41. By cutting the buildup layers and the core substrate 10 along the cutting line "C", the second metal layers 42 are respectively separated from the first metal layer 42 as shown in FIG. 3B, so that the multilayered bodies 50a and 50b can be easily separated from the core substrate 10.

In the present embodiment, the large core substrate 10 is cut, along the cutting line, by a rotary cutter. Therefore, large multilayered bodies 50a and 50b, whose surfaces are coated with the second metal layers 42 and the third metal layers 43, are separated from the large core substrate 10. Since the thickness of the second metal layers and the thickness of the third metal layers are equal, the multilayered bodies 50a and 50b are not warped, namely the flat multilayered bodies 50a and 50b can be produced. The first metal layers 41 are merely vacuum-adhered to the second metal layers 43, so the vacuum state between the two layers 41 and 42 can be easily broken by cutting the two layers 41 and 42 along the outer edge of the first metal layers 41. Therefore, the first metal layers 41 can be easily separated from the second metal layers 42.

When the cable patterns 44 are formed in the different layers, a vacuum treatment is executed so as to form the insulating layers 46. The surfaces of the core substrate 10 are vacuum-laminated with insulating films in the vacuum treatment. Degree of vacuum between the first metal layers 41 and the second metal layers 42 in the vacuum treatment step is made higher than that in other steps so as to securely vacuum-adhere the first metal layers 41 to the second metal layers 42.

In the method of the present embodiment, the cable patterns 44, the insulating layers 46 and the vias 48 are formed on the both sides of the core substrate 10 by the buildup process until the state shown in FIG. 3A. Since the buildup layers are formed on the core substrate 10 having enough toughness, size errors caused by warping the core substrate can be prevented. Therefore, sizes of the core substrate 10, etc. can be securely controlled, and the cable patterns 44, etc. can be highly concentrated. These advantages are very effective.

Note that, the buildup process for forming the buildup layers on the both sides of the core substrate 10 is known process, so conventional facilities can be used.

In FIG. 3C, the second metal layer 42 and the second metal layer 43 of the multilayered body 50a are removed, from the both sides thereof, by etching. The metal layers 42 and 43 can be simultaneously removed in the same etching solution, therefore the multilayered body 50a having no metal layers 42 and 43 is not warped. The multilayered body 50a shown in FIG. 3C has a plurality of the insulating layers 46 with proper thickness, so it can be conveyed and treated in an ordinary manufacturing line. The multilayered body 50b is also treated as well as the multilayered body 50a.

FIGS. 4A–4D are explanation views showing the steps of forming a circuit board in which outer surfaces of the multilayered body 50a shown in FIG. 3C are coated with solder resist.

Figure 4A:
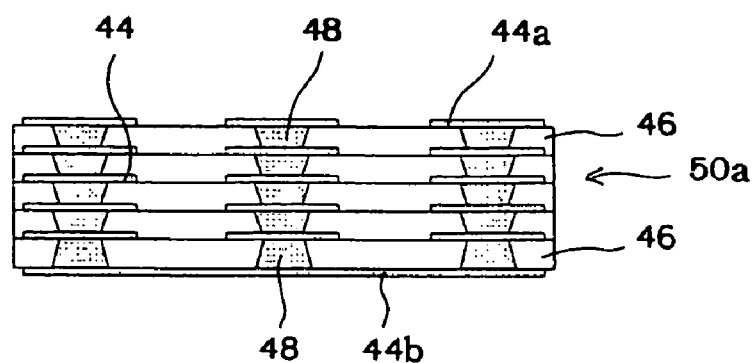
FIGS. 4A–4D are explanation views showing the steps of forming a circuit board whose surfaces are coated with solder resist.

In FIG. 4A, cable patterns 44a and 44b are respectively formed on the outermost insulating layers 46 of the multilayered body 50a and electrically connected to the cable patterns 44 in the adjacent layers by the vias 48. The cable patterns 44a and 44b are formed by the steps of: forming via holes in the outermost insulating layers 46 by laser means; executing a desmear process; executing electroless copper plating; laminating with dry films; forming resist patterns and expose parts corresponding to the cable patterns 44a and 44b; forming copper layers, which will be the cable patterns 44a and 44b, by electrolytic plating, in which the copper layers formed by electroless plating are used as electrodes for supplying an electric power; removing the resist patterns; and removing copper parts, which are formed by electroless plating and which are exposed in the outer surfaces of the multilayered body 50a. This process is called a semiadditive process.

Figure 4B:
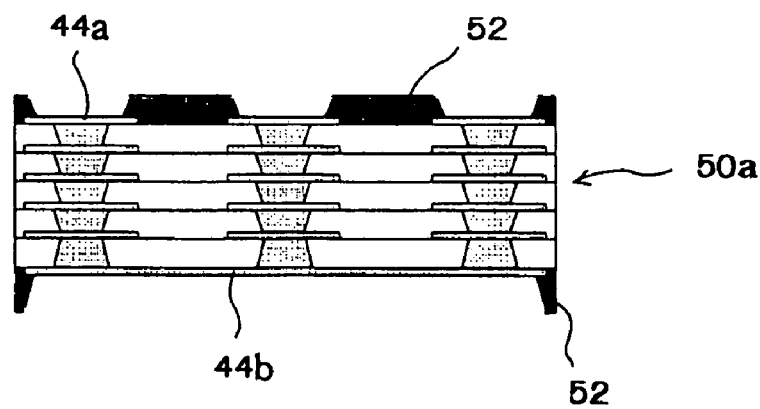
Figure 4C:
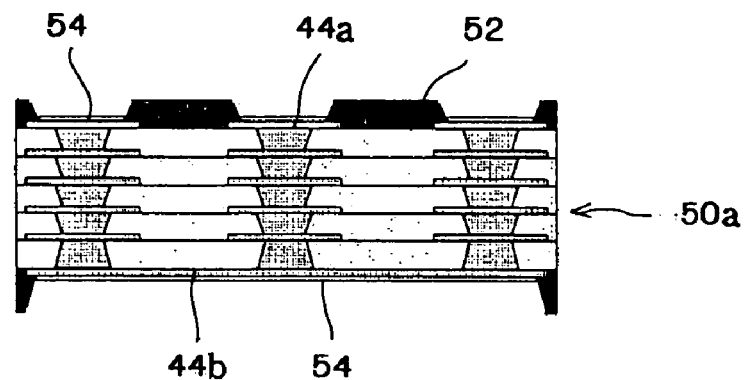

In FIG. 4B, photosensitive solder resists 52 are applied on the both outer surfaces of the multilayered body 50a, and they are exposed and developed for patterning. In FIG. 4C, surfaces of the cable patterns 44a and 44b are coated with nickel and gold, by electroless plating, so as to form protection layers 54 on the cable patterns 44a and 44b.

Figure 4D:
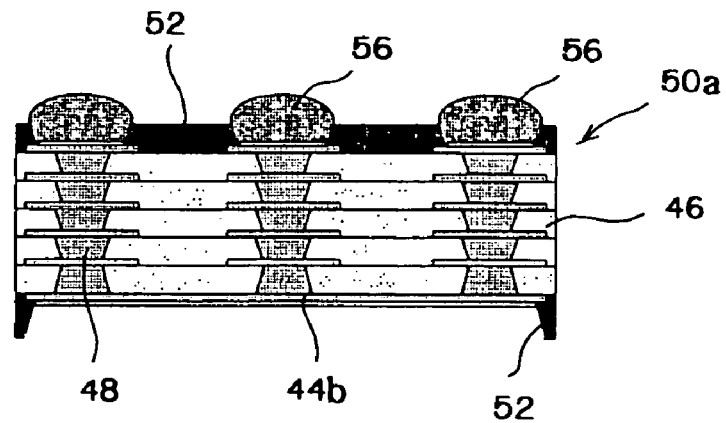

In FIG. 4D, solder is printed on the cable patterns 44a to form solder bumps 56. A semiconductor chip will be mounted on the upper surface of the multilayered body 50a, in which the solder bumps 56 are formed, so the solder bumps 56 are arranged to correspond electrodes of the semiconductor chip.

Another method of manufacturing a circuit board whose surfaces are coated with no solder resist will be explained with reference to FIGS. 5A–5C.

Figure 5A:
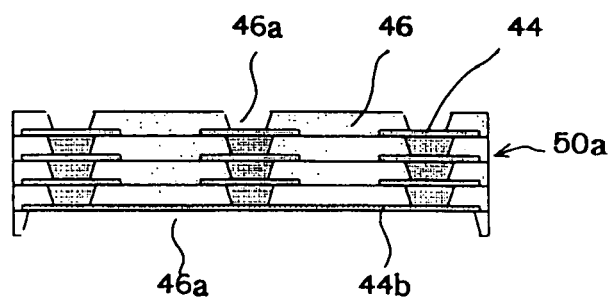
FIGS. 5A–5C are explanation views showing the steps of forming a circuit board whose surfaces are coated with no solder resist.

In FIG. 5A, the via holes 46 are formed in the outermost insulating layers 46 of the multilayered body 50a shown in FIG. 3C by laser means. Note that, in the present embodiment, the cable patterns 44b in the lower surface have been previously formed into prescribed patterns so as to connect another circuit board.

Figure 5B:
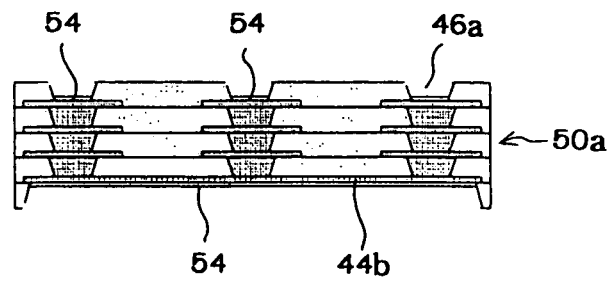

In FIG. 5B, the surfaces of the cable patterns 44a and 44b are coated with nickel and gold, by electroless plating, so as to form the protection layers 54 on the cable patterns 44a and 44b.

Figure 5C:
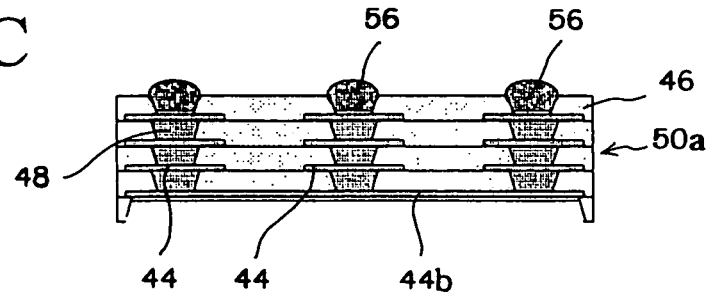

In FIG. 5C, solder is printed on the cable patterns 44 to form solder bumps 56. The circuit board is completed.

In each of the circuit boards shown in FIGS. 4D and 5C, the semiconductor chip is mounted on the surface including the solder bumps 56, so the solder bumps 56 are arranged to correspond the electrodes of the semiconductor chip. Fine cable patterns can be easily formed by the buildup process, and electrodes for connecting with the electrodes of the semiconductor chip can be easily formed at correct positions. As shown in FIGS. 4D and 5C, the circuit board manufactured by the method of the present invention has the buildup layers only, so no through-holes are bored in the core substrate 10 by a drill. Therefore, design and arrangement of the cable patterns is not limited, so cable patterns can be optionally designed and patterned in any layers.

The circuit board shown in FIG. 4D has five insulating layers 46, and the circuit board shown in FIG. 5C has four insulating layers 46. In the method of the above embodiments, the buildup layers (the multilayered bodies 50a and 50b) are formed on the both sides of the core substrate 10 in order, then the buildup layers 50a and 50b are separated from the core substrate 10. Number of layers in the multilayered body may be optionally selected. In the circuit board manufactured by the conventional method, number of layers of the buildup layers on one side of the core substrate and that on the other side are equal, so total number of the buildup layers of the circuit board is even number.

On the other hand, in the above described embodiments, number of layers of the multilayered bodies can be optionally selected. The multilayered bodies having even number and odd number of layers can be produced. Namely, unlike the above described embodiments, number of layers of the multilayered body 50a and that of the multilayered body 50b may be different. Further, design of the cable patterns in the multilayered body 50a may be different from that in the multilayered body 50b. Therefore, the circuit boards (the multilayered bodies 50a and 50b) for different products can be manufactured with one core substrate 10.

FIGS. 6A–6D and 7A–7F are explanation views showing the steps of another embodiment. In the present embodiment, outer metal layers 42a are respectively formed on the surfaces of the second metal layers 42, which are respectively formed on the both sides of the core substrate 10. This is the unique point of the present embodiment. The outer metal layers 42a is made of a metal which is not eroded by the etching solution for removing the second metal layers 42. For example, if the second metal layers 42 are made of copper, the outer metal layers 42a may be made of Cr, Ti, Ni, etc.

Figure 6A:
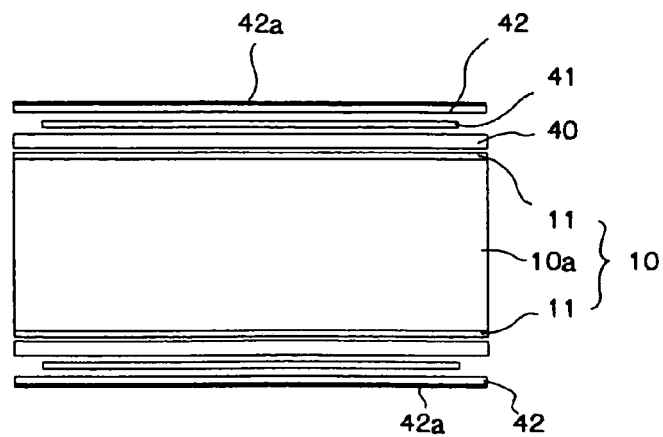
FIGS. 6A–6D are explanation views showing the steps of forming cable patterns of another example.
Figure 6B:
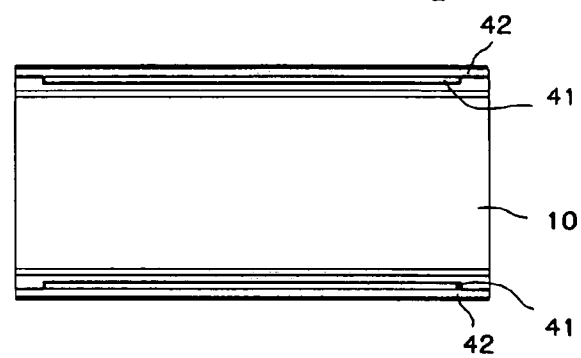

In FIG. 6A, the adhesive films 40, the first metal layers 41 and the second metal layers 42 coated with the outer metal layers 42a are provided on the both sides of the core substrate 10. In FIG. 6B, the first metal layers 41 and the second metal layers 42 are pressed on the core substrate 10, with the adhesive films 40, by the vacuum hot press.

Figure 6C:
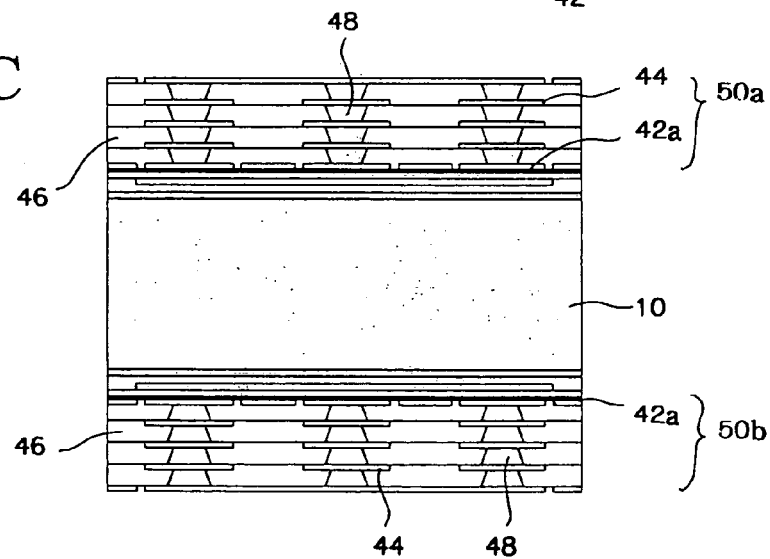

In FIG. 6C, the cable patterns 41 are formed on the both sides of the core substrate 10 by the buildup process. In the present embodiment, the outer metal layers 42a are formed on the second metal layers 42, so copper layers can be directly formed on surfaces of the outer metal layers 42a so as to form the cable pattern 44. Preferably, the outer metal layers 42a and the cable patterns 44 in the outermost layers cover the whole surfaces of the multilayered bodies 50a and 50b so as to prevent the multilayered bodies 50a and 50b from warping.

Figure 6D:
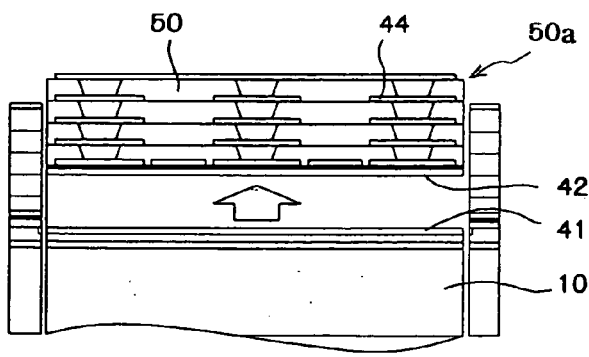

In FIG. 6D, the outer edges of the core substrate 10, etc. are cut after the multilayered bodies 50a and 50b are formed, so that the multilayered bodies 50a and 50b are separated from the core substrate 10. The first metal layers 41 are separated from the second metal layers 42 by breaking the vacuum state therebetween as well as the above described embodiments.

Figure 7A:
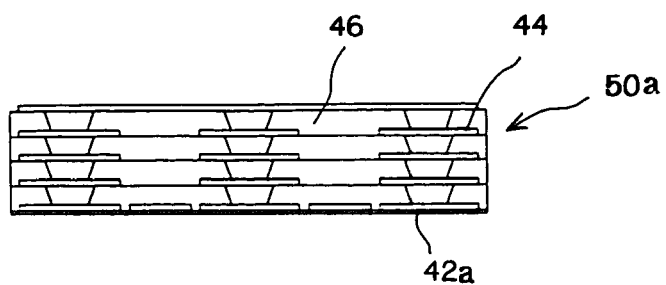
FIGS. 7A–7F are explanation views showing the steps of forming the circuit board, whose surfaces are coated with solder resist, of another example.

The steps of forming the circuit board from the multilayered body 50a will be explained with reference to FIGS. 7A–7F. In FIG. 7A, only the second metal layer 42 is selectively removed from the multilayered body 50a by etching. The etching for removing the second metal layer 42 is executed in an etching solution which does not erode the outer meal layer 42a. Next, in FIG. 7B, only the outer metal layer 42a is selectively etched. The etching is executed in an etching solution which does not erode the cable patterns 44 and the vias 48.

Figure 7B:
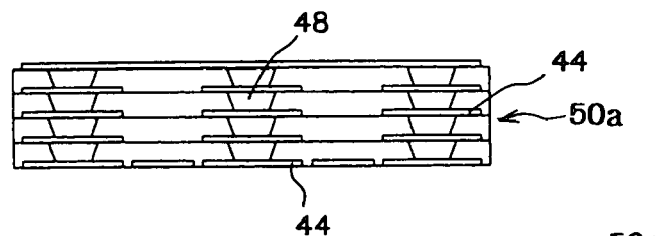
Figure 7C:
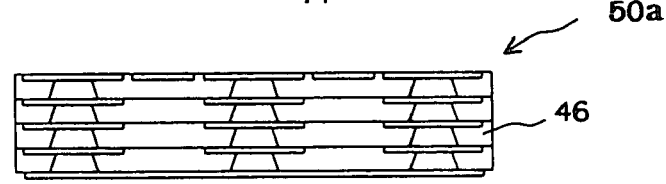

In FIG. 7C, the multilayered body 50a is inverted. A surface condition of the lower surface of the multilayered body 50a shown in FIG. 7B is not influenced by thickness of the cable patterns 44, so the bumps 56 will be formed on the flat lower surface. Further, flatness of surfaces of the solder resist 52, which will coat the surfaces of the multilayered body 50a, can be improved.

Figure 7D:
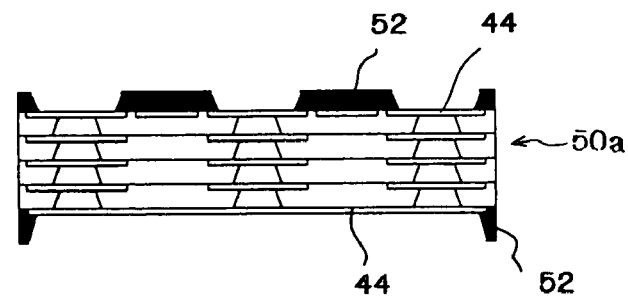
Figure 7E:
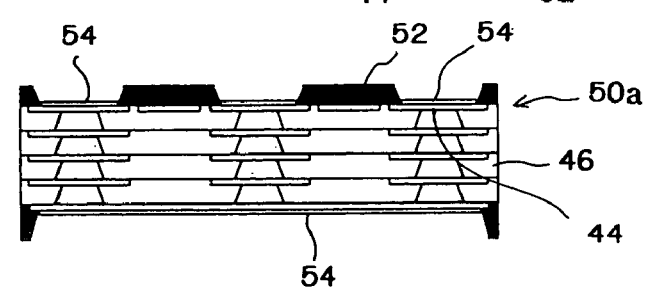
Figure 7F:
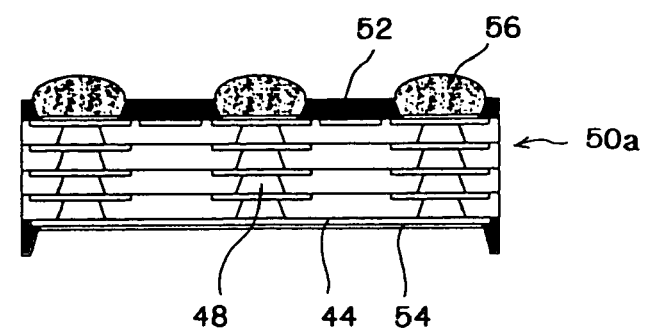
Figure 8A:
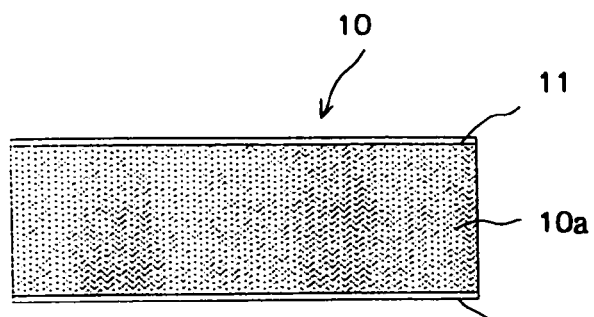
FIGS. 8A–8F and 9A–9D are explanation views showing the conventional method of manufacturing the printed circuit board.
Figure 8B:
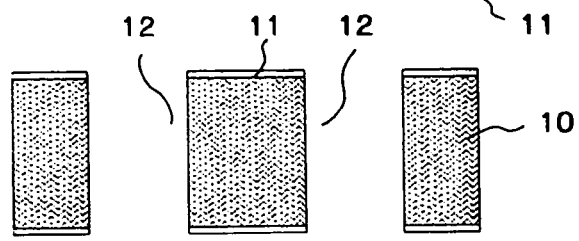
Figure 8C:
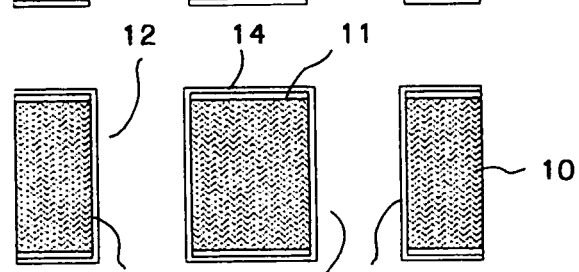
Figure 8D:
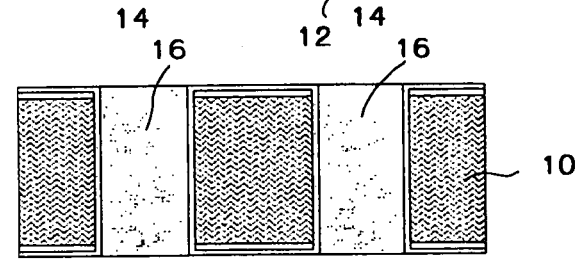
Figure 8E:
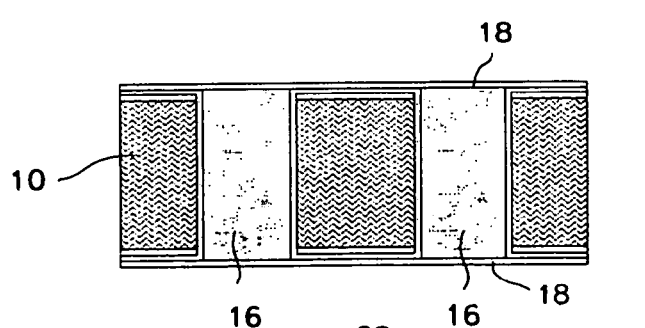
Figure 8F:
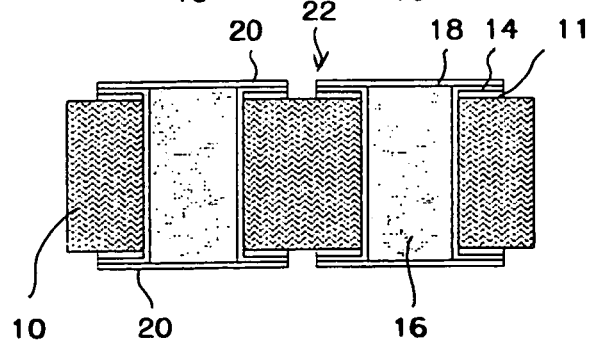
Figure 9A:
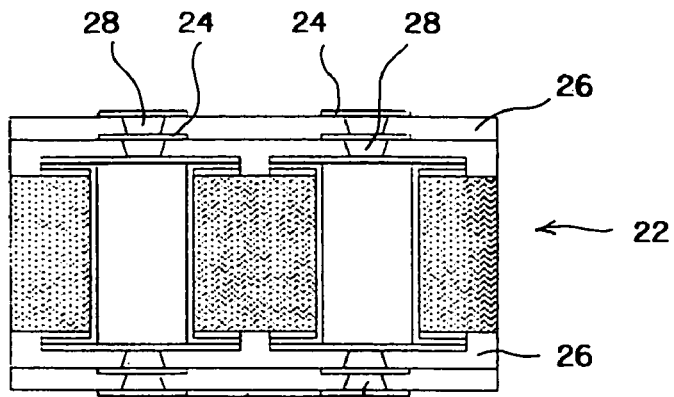
Figure 9B:
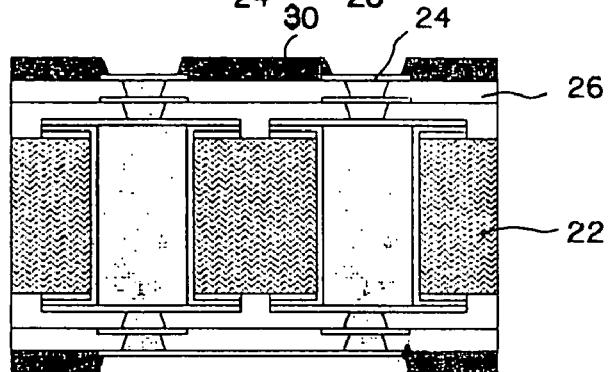
Figure 9C:
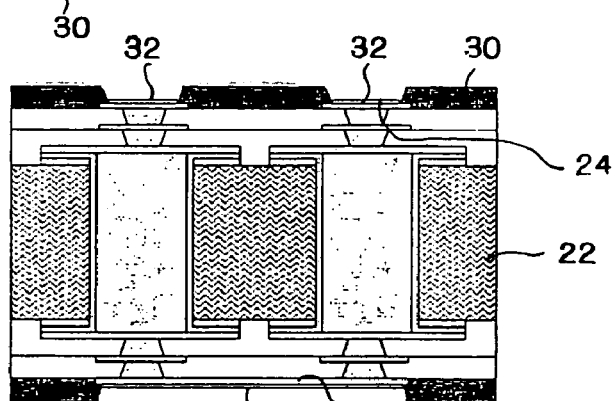
Figure 9D:
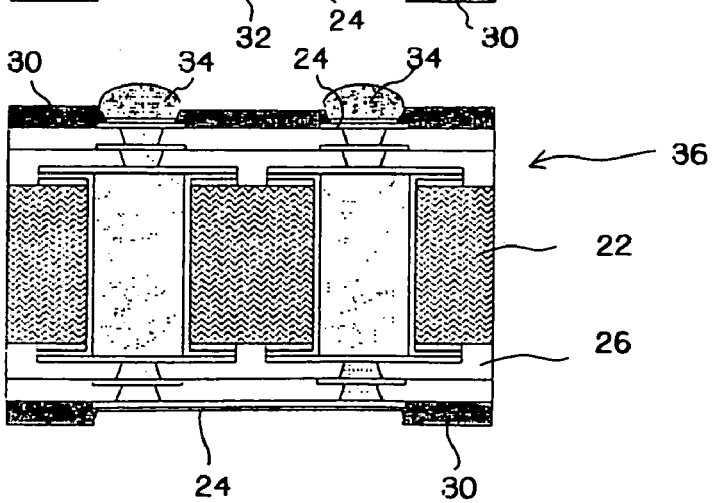

In FIG. 7D, the surfaces of the multilayered body 50a is coated with the solder resist 52. In FIG. 7E, the surfaces of the cable patterns 44 are coated with the protection layers 54. In FIG. 7F, the solder bumps 56 are formed on the multilayered body 50a. By forming the solder bumps 56, the circuit board is completed.

In the present embodiment too, the multilayered bodies 50a and 50b are formed on the core substrate 10 by the buildup process, therefore the circuit boards, in which the cable patterns are highly and precisely concentrated, can be manufactured.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. A method of manufacturing a circuit board, comprising:
   vacuum-adhering a metal layer on a surface of a core substrate;
   forming a multilayered body, in which cable patterns on different layers insulated by an insulating layer are electrically connected, on the metal layer adhered to the core substrate; and separating said multilayered body from said core substrate together with said metal layer by breaking the vacuum state between said core substrate and said metal layer.

2. The method according to claim 1, wherein said multilayered body is formed by a buildup process.

3. The method according to claim 1, wherein a third metal layer is formed on a surface of an insulating layer of said multilayered body, which is formed on the opposite of said second metal layer, before separating said multilayered body.

4. A method of manufacturing a circuit board, comprising:
forming a multilayered body, in which cable patterns on different layers insulated by an insulating layer are electrically connected, on a core substrate by a buildup process; and
separating said multilayered body from said core substrate,
wherein a first metal layer is adhered on said core substrate,
a second metal layer is vacuum-adhered on said first metal layer,
said multilayered body is formed on said second metal layer by the buildup process, and
said multilayered body is separated from said core substrate together with said second metal layer by breaking the vacuum state between said first metal layer and said second metal layer.

5. The method according to claim 4,
wherein said second metal layer is broader than said first metal layer,
an outer edge of said second metal layer, which is vacuum-adhered on said first metal layer, is adhered on said core substrate, and
said multilayered body and said core substrate are cut at a position slightly shifted inward from an outer edge of said first metal layer so as to break the vacuum state between said first metal layer and said second metal layer, whereby said multilayered body is separated from said core substrate together with said second metal layer.

6. A method of manufacturing a circuit board, comprising:
adhering a first metal layer on a surface of a core substrate by an adhesive layer;
vacuum-adhering a second metal layer on said first metal layer;
forming a multilayered body, in which cable patterns on different layers insulated by an insulating layer are electrically connected, on the second metal layer; and
separating said multilayered body from said first metal layer together with said second metal layer by breaking the vacuum state between said first metal layer and said second metal layer.

7. The method according to claim 6, wherein said multilayered body is formed by a buildup process.

8. The method according to claim 6, wherein a third metal layer is formed on a surface of an insulating layer of said multilayered body, which is formed on the opposite of said second metal layer, before separating said multilayered body.

9. The method according to claim 6, wherein an outer metal layer is further formed on said second metal layer, and said outer metal layer is made of a metal which is not corroded by an etching solution for removing said second metal layer only.

10. A method of manufacturing a circuit board, comprising:
vacuum-adhering a second metal layer on a first metal layer, which is smaller than said second metal layer;
adhering an outer edge of said second metal layer on said core substrate by said adhesive layer, which is provided on the surface of said core substrate;
forming a multilayered body, in which cable patterns on different layers insulated by an insulating layer are electrically connected, on said second metal layer; and
cutting said multilayered body at a position slightly shifted inward from an outer edge of said first metal layer, whereby said multilayered body is separated from said core substrate together with said second metal layer.

11. The method according to claim 10, wherein said multilayered body is formed by a buildup process.

12. The method according to claim 10, wherein a third metal layer is formed on a surface of an insulating layer of said multilayered body, which is formed on the opposite of said second metal layer, before separating said multilayered body.

13. The method according to claim 10, wherein an outer metal layer is further formed on said second metal layer, and said outer metal layer is made of a metal which is not corroded by an etching solution for removing said second metal layer only.

14. The method according to claim 13, wherein said metal layer is removed by etching so as to form bumps on the cable patterns.

15. The method according to claim 14, wherein said metal layer is removed by etching so as to form bumps on the cable patterns.

* * * * *